United States Patent
Tang et al.

(10) Patent No.: US 9,577,181 B2
(45) Date of Patent: *Feb. 21, 2017

(54) MAGNETIC JUNCTIONS USING ASYMMETRIC FREE LAYERS AND SUITABLE FOR USE IN SPIN TRANSFER TORQUE MEMORIES

(71) Applicant: Samsung Electronics Co., LTD., Gyeonggi-do (KR)

(72) Inventors: Xueti Tang, Fremont, CA (US); Jangeun Lee, Cupertino, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/880,650

(22) Filed: Oct. 12, 2015

(65) Prior Publication Data

US 2016/0035970 A1 Feb. 4, 2016

Related U.S. Application Data

(63) Continuation of application No. 14/558,145, filed on Dec. 2, 2014, now Pat. No. 9,184,375.

(Continued)

(51) Int. Cl.
*H01L 43/02* (2006.01)
*H01L 43/08* (2006.01)
(Continued)

(52) U.S. Cl.
CPC ............ *H01L 43/02* (2013.01); *H01L 27/222* (2013.01); *H01L 43/08* (2013.01); *H01L 43/10* (2013.01); *H01L 43/12* (2013.01); *H01L 27/228* (2013.01)

(58) Field of Classification Search
CPC .................................. H01L 43/02; H01L 43/08
See application file for complete search history.

(56) References Cited

U.S. PATENT DOCUMENTS 7,430,135 B2  9/2008  Huai
7,564,661 B2  7/2009  Ide
(Continued)

OTHER PUBLICATIONS

"Tunnel magnetoresistance properties and film structures of double MgO barrier magnetic tunnel junctions," H.D. Gan et al., Applied Physics Letters, 96, 192507 (2010), doi:10.1063/1.3429594, May 13, 2010.

(Continued)

*Primary Examiner* — Marc Armand
(74) *Attorney, Agent, or Firm* — Convergent Law Group LLP

(57) ABSTRACT

A magnetic junction usable in a magnetic device is described. The magnetic junction includes a pinned layer, a nonmagnetic spacer layer, an asymmetric free layer and a perpendicular magnetic anisotropy (PMA) inducing layer. The nonmagnetic spacer layer is between the pinned layer and the free layer. The free layer is between the nonmagnetic spacer layer and the PMA inducing layer. The asymmetric free layer includes a first ferromagnetic layer having a first boron content and a second ferromagnetic layer having a second boron content. The second boron content is less than the first boron content. The first boron content and the second boron content are each greater than zero atomic percent. The first and second ferromagnetic layers each contain at least one of Co and CoFe. The magnetic junction is configured such that the asymmetric free layer is switchable between stable magnetic states when a write current is passed through the magnetic junction.

7 Claims, 7 Drawing Sheets

Related U.S. Application Data

(60) Provisional application No. 62/020,929, filed on Jul. 3, 2014.

(51) Int. Cl.
*H01L 43/12* (2006.01)
*H01L 27/22* (2006.01)
*H01L 43/10* (2006.01)

(56) References Cited

U.S. PATENT DOCUMENTS

| | | | |
|---|---|---|---|
| 7,920,361 B2 | 4/2011 | Yoshikawa | |
| 8,183,653 B2 | 5/2012 | Peng | |
| 8,498,149 B2 | 7/2013 | Ranjan | |
| 8,604,572 B2 | 12/2013 | Wang | |
| 9,184,375 B1 * | 11/2015 | Tang | H01L 43/08 |
| 2013/0177781 A1 | 7/2013 | Chepulskyy | |
| 2013/0221459 A1 * | 8/2013 | Jan | H01L 43/08 257/421 |
| 2014/0015078 A1 | 1/2014 | Huai | |

OTHER PUBLICATIONS

"A perpendicular-anisotropy COFEB—MGO magnetc tunnel junction," S. Ikeda et al., Nature Materials, vol. 9, pp. 721-724, DOI: 10.1038/NMAT2804, Jul. 11, 2010.

"Magnetotransport properties of dual MgO barrier magnetic tunnel junctions consisting of CoFeB/FeNiSiB/CoFeB free layers," D.K. Kim et al., Applied Physics Letters, vol. 101, No. 23, pp. 232401, 232401-4, doi:10.1063/1.4768931, Dec. 31, 2012.

* cited by examiner

MAGNETIC JUNCTIONS USING ASYMMETRIC FREE LAYERS AND SUITABLE FOR USE IN SPIN TRANSFER TORQUE MEMORIES

CROSS-REFERENCE TO RELATED APPLICATIONS

This application is a continuation of U.S. patent application Ser. No. 14/558,145 filed on Dec. 2, 2014, entitled MAGNETIC JUNCTIONS USING ASYMMETRIC FREE LAYERS AND SUITABLE FOR USE IN SPIN TRANSFER TORQUE MEMORIES, assigned to the assignee of the present application and which claimed the benefit of provisional Patent Application Ser. No. 62/020,929, filed Jul. 3, 2014, entitled ASYMMETRICAL FREE LAYER FOR PERPENDICULAR MTJ, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional pinned layer 16, a conventional tunneling barrier layer 18, a conventional free layer 20, and a conventional capping layer 22. Also shown is top contact 24. Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional pinned layer 16 and the conventional free layer 20 are magnetic. The magnetization 17 of the conventional pinned layer 16 is fixed, or pinned, in a particular direction, typically by an exchange-bias interaction with the AFM layer 14. Other versions of the conventional MTJ 10 might include an additional pinned layer (not shown) separated from the free layer 20 by an additional nonmagnetic barrier or conductive layer (not shown). The conventional free layer 20 has a changeable magnetization 21. Although shown as in-plane, the magnetization 21 of the conventional free layer 20 may have a perpendicular anisotropy. In some cases, the pinned layer 16 and free layer 20 may have their magnetizations 17 and 21, respectively oriented perpendicular to the plane of the layers. For example, for thicknesses on order of twelve Angstroms or less, the free layer 20 including CoFeB may have its magnetic moment oriented perpendicular to plane. However, for higher thicknesses, the free layer magnetic moment is generally in plane.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional pinned layer 16. When a sufficient current is driven from the bottom contact 11 to the top contact 24, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. For example, mechanisms for improving the performance of STT-RAM are desired. Accordingly, what is needed is a method and system that may improve the performance of the spin transfer torque based memories. The method and system described herein address such a need.

BRIEF SUMMARY OF THE INVENTION

A magnetic junction usable in a magnetic device is described. The magnetic junction includes a pinned layer, a nonmagnetic spacer layer, an asymmetric free layer and a perpendicular magnetic anisotropy (PMA) inducing layer. The nonmagnetic spacer layer is between the pinned layer and the free layer. The free layer is between the nonmagnetic spacer layer and the PMA inducing layer. The asymmetric free layer includes a first ferromagnetic layer having a first boron content and a second ferromagnetic layer having a second boron content. The second boron content is less than the first boron content. The first boron content and the second boron content are each greater than zero atomic percent. The magnetic junction is configured such that the free layer is switchable between stable magnetic states when a write current is passed through the magnetic junction.

DETAILED DESCRIPTION OF THE INVENTION

Figure 1:
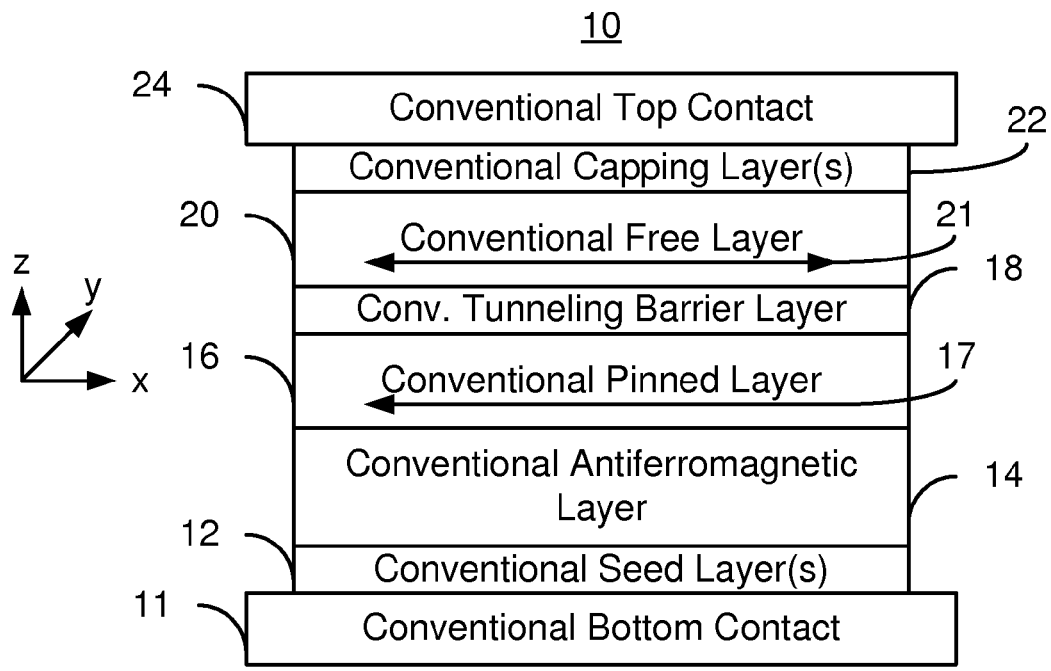
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The magnetic junction(s) described herein are usable in magnetic device(s). For example, the magnetic junction(s) may be within magnetic storage cells for a magnetic memory programmable using spin transfer torque. The magnetic memories may be usable in electronic devices that make use of nonvolatile storage. Such electronic devices include but are not limited to cellular phones, tablets, and other mobile computing devices. The magnetic junction includes a pinned layer, a nonmagnetic spacer layer, an asymmetric free layer and a perpendicular magnetic anisotropy (PMA) inducing layer. The nonmagnetic spacer layer is between the pinned layer and the free layer. The free layer is between the nonmagnetic spacer layer and the PMA inducing layer. The asymmetric free layer includes a first ferromagnetic layer having a first boron content and a second ferromagnetic layer having a second boron content. The second boron content is less than the first boron content. The first boron content and the second boron content are each greater than zero atomic percent. The magnetic junction is configured such that the free layer is switchable between stable magnetic states when a write current is passed through the magnetic junction The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions having particular layers. However, one of ordinary skill in the art will readily recognize that magnetic junctions having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
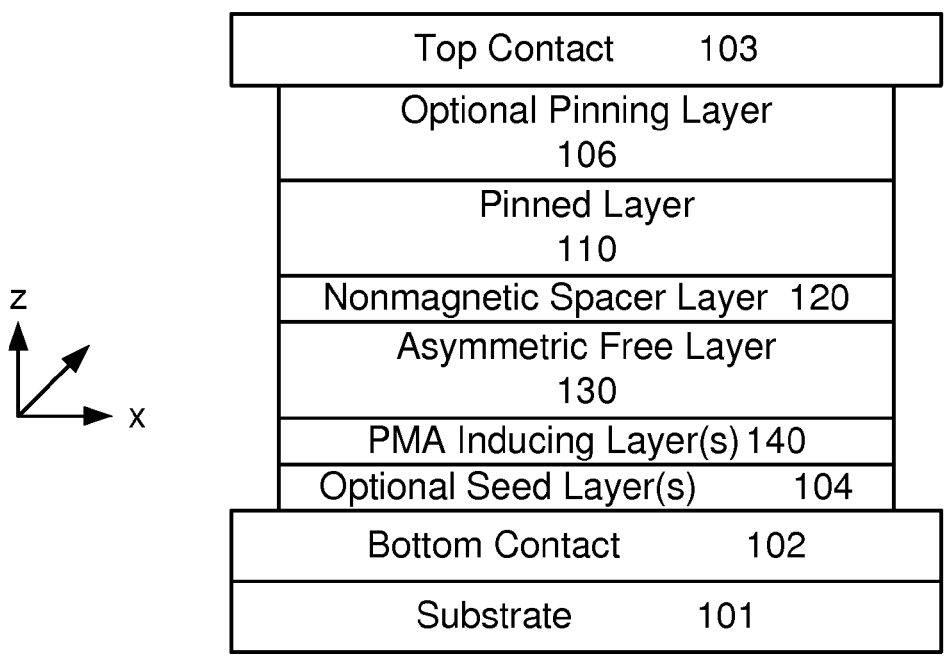
FIG. 2 depicts an exemplary embodiment of a magnetic junction usable in a magnetic memory programmable using spin transfer torque and which includes an asymmetric free layer.
Figure 3:
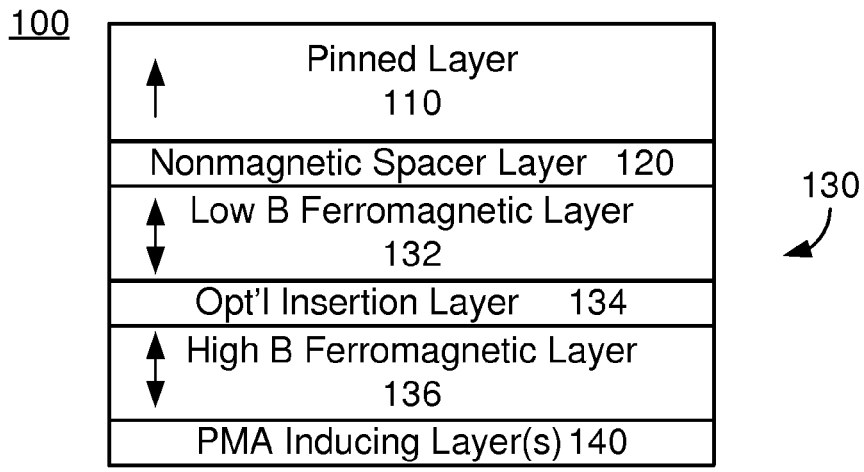
FIG. 3 depicts another exemplary embodiment of a magnetic junction usable in a magnetic memory programmable using spin transfer torque and which includes an asymmetric free layer.

FIG. 2 depicts an exemplary embodiment of a magnetic junction 100 as well as surrounding structures. For clarity, FIG. 2 is not to scale. FIG. 3 depicts an embodiment of the magnetic junction 100 without the surrounding structures. Referring to FIGS. 2-3, the magnetic junction may be used in a magnetic device such as a spin transfer torque random access memory (STT-RAM) and, therefore, in a variety of electronic devices. The magnetic junction 100 includes a pinned layer 110, a nonmagnetic spacer layer 120, an asymmetric free layer 130 and a perpendicular magnetic anisotropy (PMA) inducing layer 140. Also shown in FIG. 2 is an underlying substrate 101 in which devices including but not limited to a transistor may be formed. Although layers 110, 120, and 130 are shown with a particular orientation with respect to the substrate 101, this orientation may vary in other embodiments. For example, in the embodiments shown in FIGS. 2-3, the magnetic junction 100 is a top pinned layer junction. Thus, the free layer 130 is closer to the substrate 101 than the pinned layer 110. In other embodiments, the pinned layer 110 may be closer to the bottom (closest to the substrate 101) of the magnetic junction 100. Thus, the layers 110, 120, 130 and 140 may be reversed in order in the perpendicular-to-plane (z) direction. Also shown are optional seed layer 104 and optional pinning layer 106. The optional pinning layer 106 may be used to fix the magnetization (not shown) of the pinned layer 110. In some embodiments, the optional pinning layer 106 may be an AFM layer or multilayer that pins the magnetization (not shown) of the pinned layer 110 by an exchange-bias interaction. However, in other embodiments, the optional pinning layer 106 may be omitted or another structure may be used. For example, if the perpendicular magnetic anisotropy energy of the pinned layer 110 exceeds the out of plane demagnetization energy, the magnetic moment of the pinned layer 110 may be perpendicular to plane. In such embodiments, the pinning layer 106 may be omitted. The magnetic junction 100 is also configured to allow asymmetric the free layer 130 to be switched between stable magnetic states when a write current is passed through the magnetic junction 100. Thus, the asymmetric free layer 130 is switchable utilizing spin transfer torque. The magnetic junction 100 may also include layers not shown in FIGS. 2-3. For example, magnetic insertion layer(s), sink layer(s) and/or other layer(s) may also be present.

The pinned layer 110 is magnetic and may have its magnetization pinned, or fixed, in a particular direction during at least a portion of the operation of the magnetic junction. Although depicted as a simple layer, the pinned layer 110 may include multiple layers. For example, the pinned layer 110 may be a synthetic antiferromagnet (SAF) including magnetic layers antiferromagnetically or ferromagnetically coupled through thin layers, such as Ru. In such a SAF, multiple magnetic layers interleaved with thin layer(s) of Ru or other material may be used. The pinned layer 110 may also be another multilayer. Although a magnetization is not depicted in FIG. 2, the pinned layer 110 may have a perpendicular anisotropy energy that exceeds the out-of-plane demagnetization energy. Thus, as shown in FIG. 3, the pinned layer 110 may have its magnetic moment oriented perpendicular to plane. Other orientations of the magnetization of the pinned layer 110, including but not limited to in-plane, are possible.

The spacer layer 120 is nonmagnetic. In some embodiments, the spacer layer 120 is an insulator, for example a tunneling barrier. In such embodiments, the spacer layer 120 may include crystalline MgO, which may enhance the TMR of the magnetic junction as well as the perpendicular magnetic anisotropy of the asymmetric free layer 130. For example, such a tunneling barrier layer 120 may be at least eight Angstroms thick and not more than twelve Angstroms thick. A crystalline MgO nonmagnetic spacer layer 120 may also aid in providing a desired crystal structure and magnetic anisotropy for materials, such as CoFeB and FeB, in the asymmetric free layer 130. In alternate embodiments, the spacer layer 120 may be a conductor, such as Cu or might have another structure, for example a granular layer including conductive channels in an insulating matrix.

The asymmetric free layer 130 is magnetic and thermally stable at operating temperatures. In some embodiments, therefore, the thermal stability coefficient, Δ, of the free layer 130 is at least sixty at operating temperatures (e.g. at or somewhat above room temperature). In some embodiments, the free layer 130 is a multilayer. The magnetic junction 100 is configured such that the asymmetric free layer 130 is switchable between stable magnetic states when a write current is passed through the magnetic junction 100. For example, the magnetic junction 100 may be switchable between stable states in which the magnetic moment(s) of the free layer 130 are oriented in the +z direction or the −z direction.

The asymmetric free layer 130 is asymmetric in the perpendicular-to-plane (z) direction. In particular, the boron content of the free layer 130 varies in the perpendicular to plane direction. For example, the asymmetric free layer 130 may have a higher boron content closer to the substrate 101 and a lower boron content closer to the pinned layer 110. Alternatively, the asymmetric free layer 130 may have a higher boron content closer to the pinned layer 110 and a lower boron content closer to the substrate. Thus, in some embodiments, the boron concentration increases with increasing distance from the pinned layer 110. In other embodiments, the boron concentration decreases with increasing distance from the pinned layer 110. In some embodiments, CoFe and/or Fe are the magnetic materials that are alloyed with boron in the asymmetric free layer 130. However, other magnetic materials might be used.

In some embodiments, this asymmetry in boron concentration is provided through the use of multiple layers. One such embodiment is depicted in FIG. 3. In this embodiment, the free layer 130 includes a low boron content ferromagnetic layer 132, an optional insertion layer 134 and a high boron content ferromagnetic layer 136. Both the ferromagnetic layer 132 and 136 include B, but have differing concentrations of B. For example, the low boron content ferromagnetic layer 132 may include not more than twenty atomic percent B. For example, the low boron content ferromagnetic layer 132 may be $Fe_{1-x}B_x$, $(CoFe)_{1-x}B_x$, where x is less than or equal to 0.2. Note that x may change throughout the layer 132 as long as x does not exceed 0.2. The high boron content layer 136 may have greater than twenty atomic percent boron. In some embodiments, the boron concentration of the ferromagnetic layer 136 is also not more than fifty atomic percent. Thus, the high boron content ferromagnetic layer 136 may be $Fe_{1-x}B_x$, $(CoFe)_{1-x}B_x$, where x is less than or equal to 0.5 and greater than 0.2. In some embodiments, the high boron content ferromagnetic layer 136 includes at least twenty-five atomic percent and not more than forty five atomic percent boron. For example, the high boron content ferromagnetic layer 136 may include at least thirty-five atomic percent and not more than forty five atomic percent boron. In such embodiments, therefore, the high boron content ferromagnetic layer 136 may be $Fe_{1-x}B_x$, $(CoFe)_{1-x}B_x$, where x is less than or equal to 0.45 and greater than or equal to 0.35. The concentration of boron may also vary within the layer 136 as long as it remains within the limits described above. In another embodiments, the boron concentration of the asymmetric free layer 130 may vary substantially continuously and/or without clearly defined layers. The CoFe in the layers 132 and 136 may be various stoichiometries including but not limited to 1:1 through 1:4. In some embodiments, the ratio of Fe to Co is 3:1.

The free layer 130 may also include a nonmagnetic insertion layer 134, which is optional. The nonmagnetic insertion layer 134 includes at least one of Bi, Ta, W, V, I, Zn, Nb, Ag, Cd, Hf, Os, Mo, Ca, Hg, Sc, Y, Sr, Mg, Ti, Ba, K, Na, Rb, Pb, and Zr in some embodiments. The nonmagnetic insertion layer 134 assists in ensuring that the perpendicular magnetic anisotropy (PMA) of each of the ferromagnetic layers 132 and 136 exceeds the out-of-plane demagnetization energy. Thus, the presence of the nonmagnetic insertion layer 134 aids in the use of thicker ferromagnetic layers 132 and 136 while preserving the perpendicular orientation of the stable states of the layers 132 and 136. In other embodiments, however, the insertion layer 134 may be omitted.

The thicknesses of the ferromagnetic layers 132 and 136 may be desired to be thin in order to ensure the perpendicular magnetic anisotropy (PMA) exceeds the out-of-plane demagnetization energy for each of the layers 132 and 136. Thus, as shown in FIG. 3, the magnetic moments of the layers 132 and 136 may be stable when oriented perpendicular to plane. If the nonmagnetic insertion layer 134 is omitted, then the free layer 130 thickness (the thicknesses of both the layers 132 and 136 combined) is desired to be not more than thirty Angstroms. If, however, the nonmagnetic insertion layer 134 is present, then the free layer 130 may be thicker. In some embodiments, the free layer thickness may be less than thirty Angstroms. In some such embodiments, the free layer thickness does not exceed twenty Angstroms. For a free layer 130 having its stable magnetic states with the magnetic moment oriented substantially perpendicular-to-plane, the layers 132 and 136 may each be desired to be less than fifteen Angstroms thick. In some embodiments, the layers 132 and 136 are each not more than twelve Angstroms thick and at least three Angstroms thick. Further, the low boron concentration layer 132 may be desired to be thicker than the high boron content layer 136. For example, the layer 136 may be nominally six Angstroms thick, while the layer 132 is nominally eight Angstroms thick. As a result, the magnetic moments of the layers 132 and 136 are stable perpendicular-to-plane.

The free layer 130 also includes a PMA inducing layer 140. The PMA inducing layer may be used to improve the PMA of the free layer 130. For example, the PMA inducing layer 140 may include an MgO layer that may be analogous to the nonmagnetic spacer layer 120. However, the PMA inducing layer 140 may be thinner than an MgO nonmagnetic spacer layer 120. In some embodiments, the PMA inducing layer 140 may be at least four Angstroms and not more than eight Angstroms.

The magnetic junction 100 may have enhanced magnetoresistance. This is believed to be due to the asymmetric concentration of boron in the asymmetric free layer 130. If the free layer 130 only included low boron concentration (e.g. not more than twenty atomic percent), it is believed that the tunneling magnetoresistance of the magnetic junction would be depressed. However, the layer 136 may have a high boron concentration, as defined above, while the layer 132 may have a low boron concentration. This gradient in boron concentration may result in an enhanced magnetoresistance for the magnetic junction 100. For example, a tunneling magnetoresistance on the order of two hundred percent or more may be achieved for a free layer including CoFeB in the layers 132 and 136 and using MgO for the layers 120 and 140. It is believed that the high boron concentration, for example in the high boron content layer 136, improves the crystallinity of the MgO layer 120 or 140 that is further from the substrate 101. This may be understood as follows.

Presume that the PMA layer 140 is deposited first and that layers 120 and 140 are MgO. However, an analogous discussion may hold if the nonmagnetic spacer layer 120 is deposited first. The crystal structure of the first-deposited PMA layer 140 may affect the crystal structure of the second-deposited nonmagnetic spacer layer 120. If only lower concentrations of boron were present in a free layer, the later-formed nonmagnetic spacer layer may not have the desired crystal structure. However, the free layer 130 has an asymmetric boron concentration. Thus, the free layer 130 may include the high content boron layer 136. It is believed that the higher boron concentration in the layer 136 blocks, mitigates, or delays the effect of the crystal structure of the PMA layer 140 on the nonmagnetic spacer layer 120. As a result, the nonmagnetic spacer layer 120 is better allowed to crystallize with the desired structure and orientation. For example, (001) MgO may be more likely to be present in the nonmagnetic spacer layer 120 as well as the PMA layer 130. Consequently, the magnetoresistance of the magnetic junction 100 may be improved. Note that although this improvement is discussed within the context of a particular mechanism (e.g. boron concentration of the free layer 130), the structures described herein are not limited to functioning by this mechanism. Further, nothing prevents the structures described herein from use without the above-described mechanism and/or benefits.

The magnetic junction 100 and asymmetric free layer 130 may have improved performance. The asymmetric free layer 130 may be switched using spin transfer torque. Thus, a more localized physical phenomenon may be used to write to the magnetic junction 100. The magnetic junction 100 may have stable magnetic states of the asymmetric free layer 130 oriented perpendicular-to-plane, have an enhanced magnetoresistance/tunneling magnetoresistance and improved spin transfer based switching. The PMA inducing layer 140 and a tunneling barrier layer such as MgO for the nonmagnetic spacer layer 120 assist in ensuring that the free layer magnetic moment(s) are oriented perpendicular-to-plane. The magnetic materials used in asymmetric free layer 130/ferromagnetic layers 132 and 136 and the thicknesses of the asymmetric free layer 130/ferromagnetic layers 132 and 136 may also be configured such that the perpendicular-to-plane orientation of the magnetic moment(s) is achieved. The presence of the optional insertion layer 134 may further assist in obtaining this magnetic orientation. As a result, the spin transfer switching of the magnetic junction 100 may be improved. Further, as discussed above, magnetoresistance of the magnetic junction 100 may be enhanced. Thus, performance of a device utilizing the magnetic junction 100 may be improved.

Figure 4:
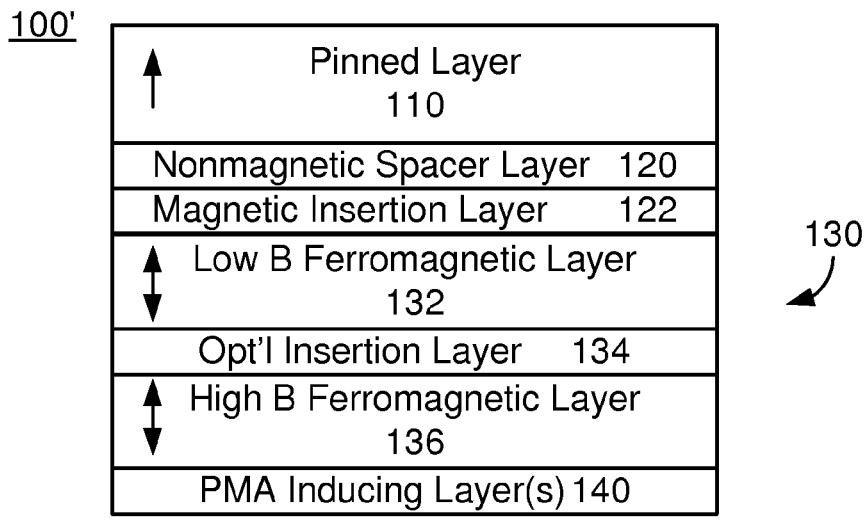
FIG. 4 depicts another exemplary embodiment of a magnetic junction usable in a magnetic memory programmable using spin transfer torque and which includes an asymmetric free layer.

FIG. 4 depicts another exemplary embodiment of a magnetic junction 100' usable in a magnetic device. The magnetic device in which the magnetic junction 100' is used may be used in a variety of applications. For example, the magnetic device, and thus the magnetic junction, may be used in a magnetic memory such as an STT-MRAM. For clarity, FIG. 4 is not to scale.

The magnetic junction 100' is analogous to the magnetic junction 100. Consequently, analogous components are labeled similarly. The magnetic junction 100' thus includes a pinned layer 110, a nonmagnetic spacer layer 120, an asymmetric free layer 130 and a PMA inducing layer 140 analogous to those depicted in FIGS. 2-3. The free layer 130 is also shown as including the low boron content ferromagnetic layer 132, optional insertion layer 134 and high boron content ferromagnetic layer 136. Although layers 110, 120, 130 and 140 are shown with a particular orientation, this orientation may vary in other embodiments. For example, the pinned layer 110 may be closer to the bottom of the magnetic junction 100' and the order of the layers 110, 120, 130 and 140 may be reversed. Similarly, the layers 132, 134 and 136 are shown with a particular orientation. In other embodiments, the orientation may vary. For example, the order of the layers 132, 134, and 136 may be reversed such that the layer 132 is closest to the PMA inducing layer 140. The magnetic junction 100' is also configured to allow the free layer 130 to be switched between stable magnetic states when a write current is passed through the magnetic junction 100'. Thus, the free layer 130 is switchable utilizing spin transfer torque.

The structure and function of the layers 110, 120, 130, 132, 134, 136 and 140 are analogous to those described above. For example, the free layer 130 may have its magnetic moments oriented perpendicular-to-plane when stable, as shown in FIG. 4, and has an asymmetric boron concentration. The gradient in the boron concentration for the free layer 130 and the layer(s) 132 and 136 is analogous to that discussed above. In some embodiments, the layer 134 may be omitted.

The magnetic junction 100' also includes a magnetic insertion layer 122 between the nonmagnetic spacer layer 120 and the asymmetric free layer 130. For example, the magnetic insertion layer may include at least one of Fe and CoFe. In some embodiments, the insertion layer is an Fe layer. In some embodiments, the CoFe insertion layer is desired to have a Co to Fe ratio of 1:3. In some embodiments, the magnetic insertion layer 122 may be considered to be part of the free layer 130. The magnetic insertion layer 122 is generally desired to be thin. For example, the magnetic insertion layer 122 may be at least two Angstroms and not more than six Angstroms thick. In some embodiments, the magnetic insertion layer 122 is nominally four Angstroms thick. Use of the magnetic insertion layer may improve the magnetoresistance of the magnetic junction 100'.

The magnetic junction 100' may have improved performance. The asymmetric free layer 130 may be switched using spin transfer torque. Thus, a more localized physical phenomenon may be used to write to the magnetic junction 100'. The magnetic junction 100' may have stable magnetic states of the asymmetric free layer 130 oriented perpendicular-to-plane, which may improve spin transfer based switching. The magnetic junction 100' may have an enhanced magnetoresistance/tunneling magnetoresistance that may be due to the asymmetric free layer 130. Thus, performance of a device utilizing the magnetic junction 100' may be improved.

Figure 5:
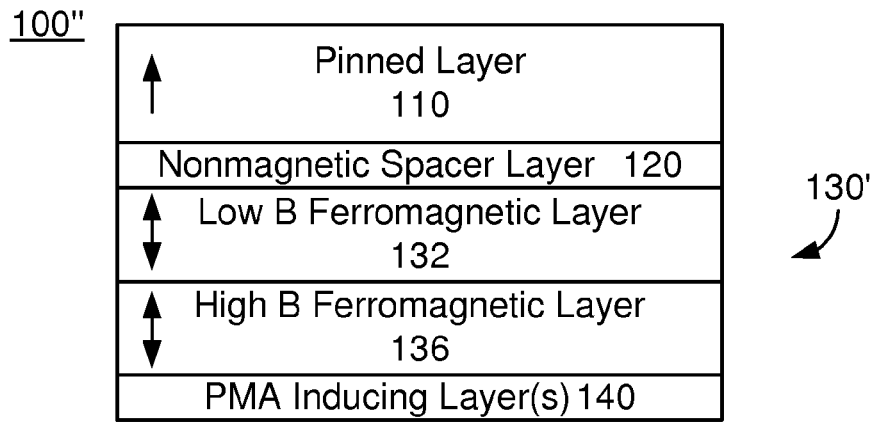
FIG. 5 depicts another exemplary embodiment of a magnetic junction usable in a magnetic memory programmable using spin transfer torque and which includes an asymmetric free layer.

FIG. 5 depicts another exemplary embodiment of a magnetic junction 100" usable in a magnetic device. The magnetic device in which the magnetic junction 100" is used may be used in a variety of applications. For example, the magnetic device, and thus the magnetic junction, may be used in a magnetic memory such as an STT-MRAM. For clarity, FIG. 5 is not to scale.

The magnetic junction 100" is analogous to the magnetic junction(s) 100 and/or 100'. Consequently, analogous components are labeled similarly. The magnetic junction 100" thus includes a pinned layer 110, a nonmagnetic spacer layer 120, an asymmetric free layer 130' and a PMA inducing layer 140 analogous to the layers 120, 130 and 140 depicted in FIGS. 2-4. The free layer 130' is also shown as including the low boron content ferromagnetic layer 132 and high boron content ferromagnetic layer 136. Although layers 110, 120, 130' and 140 are shown with a particular orientation, this orientation may vary in other embodiments. For example, the pinned layer 110 may be closer to the bottom of the magnetic junction 100" and the order of the layers 110, 120, 130' and 140 may be reversed. Similarly, the layers 132 and 136 are shown with a particular orientation. In other embodiments, the orientation may vary. For example, the order of the layers 132 and 136 may be reversed such that the layer 132 is closest to the PMA inducing layer 140. The magnetic junction 100" is also configured to allow the free layer 130' to be switched between stable magnetic states when a write current is passed through the magnetic junction 100". Thus, the free layer 130' is switchable utilizing spin transfer torque.

The structure and function of the layers 110, 120, 130', 132, 136 and 140 are analogous to those described above for the layers 110, 120, 130, 132, 136 and 140, respectively. For example, the free layer 130' may have its magnetic moments oriented perpendicular-to-plane when stable, as shown in FIG. 5, and has an asymmetric boron concentration. The gradient in the boron concentration for the free layer 130' and the layer(s) 132 and 136 is analogous to that discussed above.

In the magnetic junction 100", the nonmagnetic insertion layer is omitted from the free layer 130'. Thus, the layers 132 and 136 share an interface. As a result, the free layer 130' may be thinner in order to ensure that the magnetic moment of the free layer 130' is perpendicular-to-plane. For example, the sum of the thicknesses of the layers 132 and 136 may be on the order of twelve Angstroms.

The magnetic junction 100" may have improved performance. The asymmetric free layer 130' may be switched using spin transfer torque. Thus, a more localized physical phenomenon may be used to write to the magnetic junction 100". The magnetic junction 100" may have stable magnetic states of the asymmetric free layer 130' oriented perpendicular-to-plane, which may improve spin transfer based switching. The magnetic junction 100" may have an enhanced magnetoresistance/tunneling magnetoresistance or reduced damping constant that may be due to the asymmetric free layer 130'. Thus, performance of a device utilizing the magnetic junction 100" may be improved.

Figure 6:
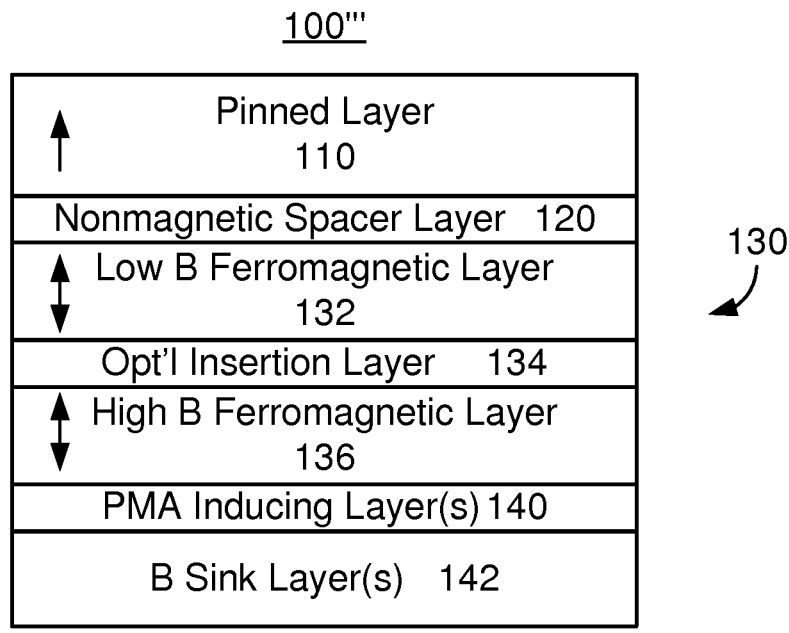
FIG. 6 depicts another exemplary embodiment of a magnetic junction usable in a magnetic memory programmable using spin transfer torque and which includes an asymmetric free layer.

FIG. 6 depicts another exemplary embodiment of a magnetic junction 100''' usable in a magnetic device. The magnetic device in which the magnetic junction 100''' is used may be used in a variety of applications. For example, the magnetic device, and thus the magnetic junction, may be used in a magnetic memory such as an STT-MRAM. For clarity, FIG. 6 is not to scale.

The magnetic junction 100''' is analogous to the magnetic junction(s) 100, 100' and/or 100". Consequently, analogous components are labeled similarly. The magnetic junction 100''' thus includes a pinned layer 110, a nonmagnetic spacer layer 120, an asymmetric free layer 130 and a PMA inducing layer 140 analogous to those depicted in FIGS. 2-5. The free layer 130 is also shown as including the low boron content ferromagnetic layer 132, optional insertion layer 134 and high boron content ferromagnetic layer 136. Although layers 110, 120, 130 and 140 are shown with a particular orientation, this orientation may vary in other embodiments. For example, the pinned layer 110 may be closer to the bottom of the magnetic junction 100''' and the order of the layers 110, 120, 130 and 140 may be reversed. Similarly, the layers 132, 134 and 136 are shown with a particular orientation. In other embodiments, the orientation may vary. For example, the order of the layers 132, 134, and 136 may be reversed such that the layer 132 is closest to the PMA inducing layer 140. The magnetic junction 100''' is also configured to allow the free layer 130 to be switched between stable magnetic states when a write current is passed through the magnetic junction 100'''. Thus, the free layer 130 is switchable utilizing spin transfer torque.

The structure and function of the layers 110, 120, 130, 132, 134, 136 and 140 are analogous to those described above. For example, the free layer 130 may have its magnetic moments oriented perpendicular-to-plane when stable, as shown in FIG. 6, and has an asymmetric boron concentration. The gradient in the boron concentration for the free layer 130 and the layer(s) 132 and 136 is analogous to that discussed above. In some embodiments, the layer 134 may be omitted.

The magnetic junction 100''' also includes a boron sink layer 142 such that the PMA induction layer 140 is between the boron sink layer 142 and the free layer 130. In the embodiment shown, the boron sink layer 142 also functions as a seed layer. However, in other embodiments, the boron sink layer 142 may be a capping layer, for example if the PMA layer 140 is furthest from the bottom of the magnetic junction 100'''. The boron sink layer 142 may include material(s) that have an affinity for boron. For example, materials such as Ta, W, Fe, and/or CoFe may be used. The boron sink layer 142 may provide a location to which boron may diffuse during annealing or other processing of the magnetic junction 100'''. Thus, stoichiometry of the remaining layers 110, 120, 130 and 140 may be closer to that which is desired.

The magnetic junction 100''' may have improved performance. The asymmetric free layer 130 may be switched using spin transfer torque. Thus, a more localized physical phenomenon may be used to write to the magnetic junction 100'''. The magnetic junction 100''' may have stable magnetic states of the asymmetric free layer 130 oriented perpendicular-to-plane, which may improve spin transfer based switching. The magnetic junction 100''' may have an enhanced magnetoresistance/tunneling magnetoresistance that may be due to the asymmetric free layer 130. Thus, performance of a device utilizing the magnetic junction 100''' may be improved.

Figure 7:
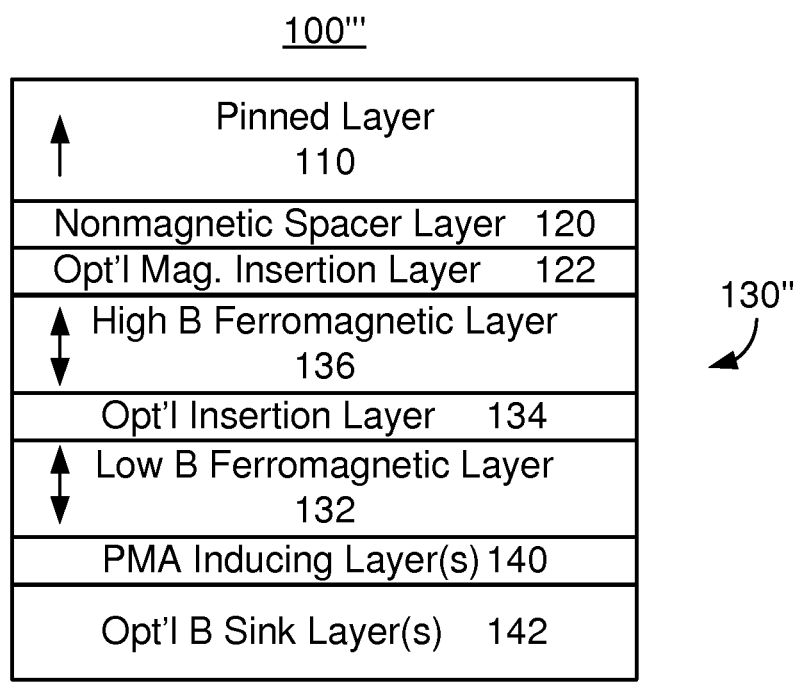
FIG. 7 depicts another exemplary embodiment of a magnetic junction usable in a magnetic memory programmable using spin transfer torque and which includes an asymmetric free layer.

FIG. 7 depicts another exemplary embodiment of a magnetic junction 100'''' usable in a magnetic device. The magnetic device in which the magnetic junction 100'''' is used may be used in a variety of applications. For example, the magnetic device, and thus the magnetic junction, may be used in a magnetic memory such as an STT-MRAM. For clarity, FIG. 7 is not to scale.

The magnetic junction 100'''' is analogous to the magnetic junction(s) 100, 100', 100'' and/or 100'''. Consequently, analogous components are labeled similarly. The magnetic junction 100'''' thus includes a pinned layer 110, a nonmagnetic spacer layer 120, an asymmetric free layer 130'' and a PMA inducing layer 140 analogous to those depicted in FIGS. 2-6. The free layer 130'' is also shown as including the low boron content ferromagnetic layer 132, optional insertion layer 134 and high boron content ferromagnetic layer 136. Although layers 110, 120, 130'' and 140 are shown with a particular orientation, this orientation may vary in other embodiments. For example, the pinned layer 110 may be closer to the bottom of the magnetic junction 100'''' and the order of the layers 110, 120, 130 and 140 may be reversed. The magnetic junction 100'''' is also configured to allow the free layer 130'' to be switched between stable magnetic states when a write current is passed through the magnetic junction 100''''. Thus, the free layer 130'' is switchable utilizing spin transfer torque.

The structure and function of the layers 110, 120, 130'', 132, 134, 136 and 140 are analogous to those described above. For example, the free layer 130'' may have its magnetic moments oriented perpendicular-to-plane when stable, as shown in FIG. 7, and has an asymmetric boron concentration. The gradient in the boron concentration for the free layer 130 and the layer(s) 132 and 136 is analogous to that discussed above. However, in the embodiment shown, the order of the layers 132, 134, and 136 has been reversed such that the layer 132 is closest to the PMA inducing layer 140. In some embodiments, the layer 134 may be omitted.

The magnetic junction 100'''' is also shown as including an optional boron sink layer 142 and an optional magnetic insertion layer 122. The layers 122 and 142 are analogous to those discussed above. One or both of the layers 122 and 142 may be included in the magnetic junction 100''''. Alternatively, one or both of the layers 122 and 142 may be omitted.

The magnetic junction 100'''' may have improved performance. The asymmetric free layer 130'' may be switched using spin transfer torque. Thus, a more localized physical phenomenon may be used to write to the magnetic junction 100''''. The magnetic junction 100'''' may have stable magnetic states of the asymmetric free layer 130'' oriented perpendicular-to-plane, which may improve spin transfer based switching. The magnetic junction 100'''' may have an enhanced magnetoresistance/tunneling magnetoresistance that may be due to the asymmetric free layer 130''. Thus, performance of a device utilizing the magnetic junction 100'''' may be improved.

Note that FIGS. 2-7 have been described in the context of particular features. For example, certain layers have been included or omitted in various embodiments. However, one of ordinary skill in the art will recognize that the one or more of the features in the embodiments 100, 100', 100'', 100''' and/or 100'''' depicted in FIGS. 2-7 may be combined.

Figure 8:
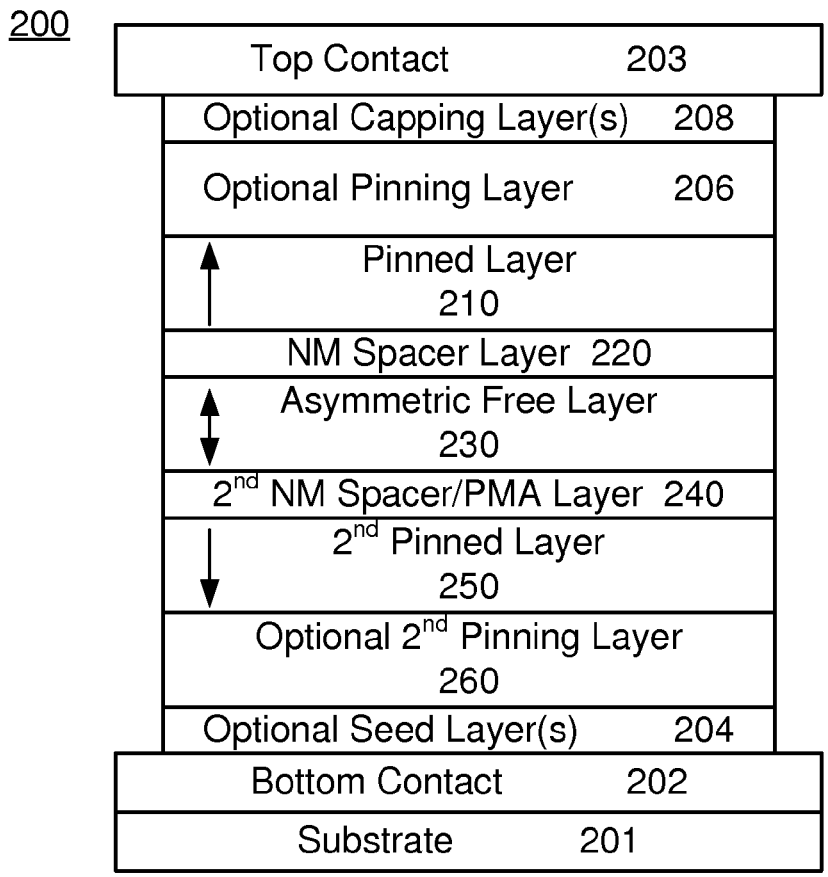
FIG. 8 depicts an exemplary embodiment of a dual magnetic junction usable in a magnetic memory programmable using spin transfer torque and which includes an asymmetric free layer.
Figure 9:
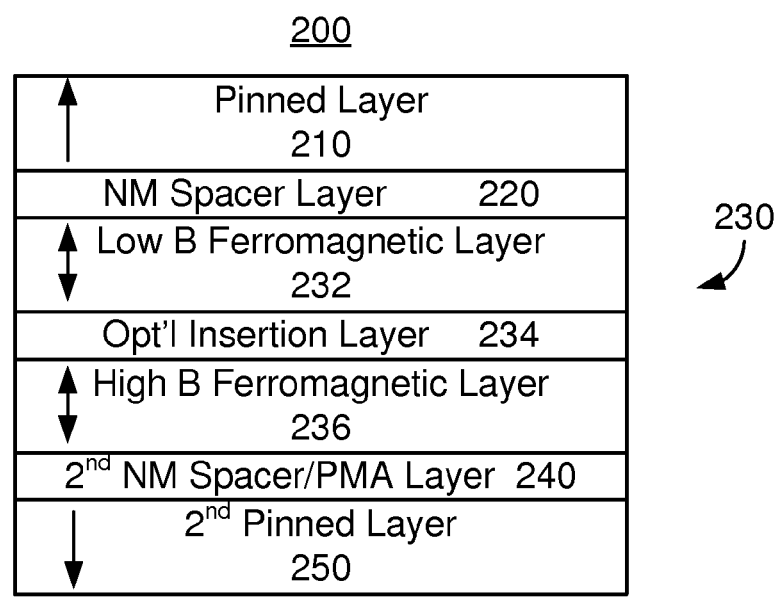
FIG. 9 depicts another exemplary embodiment of a dual magnetic junction usable in a magnetic memory programmable using spin transfer torque and which includes an asymmetric free layer.

FIGS. 8-9 depict another exemplary embodiment of a magnetic junction 200 usable in a magnetic device. FIG. 8 depicts the magnetic junction 200 as well as surrounding structures. FIG. 9 depicts the magnetic junction 200 without the surrounding structures and with a particular embodiment of the asymmetric free layer. The magnetic device in which the magnetic junction 200 is used may be used in a variety of applications. For example, the magnetic device, and thus the magnetic junction, may be used in a magnetic memory such as an STT-MRAM. For clarity, FIGS. 8 and 9 are not to scale.

The magnetic junction 200 is analogous to the magnetic junctions 100, 100', 100'', 100''' and/or 100''''. Consequently, analogous components are labeled similarly. The magnetic junction 200 thus includes a pinned layer 210, a nonmagnetic spacer layer 220, an asymmetric free layer 230 analogous to the layers 110, 120 and 130/130'/130'', respectively, depicted in FIGS. 2-7. The magnetic junction 200 also includes an additional nonmagnetic spacer layer 240 and an additional pinned layer 250. The additional nonmagnetic spacer layer 240 is analogous to the nonmagnetic spacer layer 120 as well as to the PMA inducing layer 140. The additional pinned layer 250 is analogous to the pinned layer 110/210. Thus, the magnetic junction 200 is a dual magnetic junction. FIG. 8 also depicts a substrate 201, bottom contact 202, optional seed layers 204, optional pinning layer 206 and top contact 203 that are analogous to the substrate 101, bottom contact 102, optional seed layers 104, optional pinning layer 106 and top contact 103, respectively. The magnetic junction 200 also includes an optional pinning layer 260 that is analogous to the optional pinning layer 206.

The free layer 230 is shown as including a low boron content ferromagnetic layer 232, optional insertion layer 234 and high boron content ferromagnetic layer 236 in FIG. 9. The low boron content ferromagnetic layer 232, optional insertion layer 234 and high boron content ferromagnetic layer 236 are analogous to the layers 132, 134 and 136, respectively. The layers 232, 234 and 236 are shown with a particular orientation. In other embodiments, the orientation may vary. For example, the order of the layers 232, 234, and 236 may be reversed such that the layer 232 is closest to the second nonmagnetic spacer layer/PMA inducing layer 240. The magnetic junction 200 is also configured to allow the free layer 230 to be switched between stable magnetic states when a write current is passed through the magnetic junction 200. Thus, the free layer 230 is switchable utilizing spin transfer torque.

The structure and function of the layers 210, 220, 230, 232, 234 and 236 are analogous to those described above for layers 110, 120, 130/130'/130", 232, 234 and 236, respectively. For example, the free layer 230 may have its magnetic moments oriented perpendicular-to-plane when stable and has an asymmetric boron concentration. The gradient in the boron concentration for the free layer 230 and the layer(s) 232 and 236 is analogous to that discussed above for the layers 130/130'/130", 132 and 136, respectively. In some embodiments, the layer 234 may be omitted.

The pinned layers 210 and 250 are magnetic and may have their magnetizations pinned, or fixed, in a particular direction during at least a portion of the operation of the magnetic junction. Although depicted as a simple (single) layers, the pinned layer(s) 210 and/or 250 may include multiple layers. For example, the pinned layer(s) 210 and/or 250 may be SAF(s). The pinned layer(s) 210 and/or 250 may also be another multilayer. As depicted in FIG. 9, the pinned layers 210z and/or 250 may have a perpendicular anisotropy energy that exceeds the out-of-plane demagnetization energy. Thus, as shown in FIG. 9, the pinned layer(s) 210 and/or 250 may have its magnetic moment oriented perpendicular to plane. Other orientations of the magnetization of the pinned layer (s) 210 and/or 250, including but not limited to in-plane, are possible. The magnetic moments of the pinned layers 210 and 250 are shown as being antiparallel (in the dual state) However, in other embodiments or during certain operations, the magnetic moments of the pinned layers 210 and 250 may be parallel. Such an orientation may enhance magnetoresistance. In other embodiments, the orientations of the magnetic moments of the pinned layers 210 and 250 may be set differently for read and write operations.

The spacer layers 220 and 240 are nonmagnetic. In some embodiments, the spacer layer(s) 220 and 240 may each an insulator, for example a tunneling barrier. In such embodiments, the spacer layer(s) 220 and/or 240 may include crystalline MgO, which may enhance the TMR of the magnetic junction as well as the perpendicular magnetic anisotropy of the asymmetric free layer 230. A crystalline MgO nonmagnetic spacer layer 220 may also aid in providing a desired crystal structure and magnetic anisotropy for materials, such as CoFeB and FeB, in the asymmetric free layer 230. In such embodiments, one or both of the layers 220 and 240 may have a thickness of at least two and not more than five Angstroms. In alternate embodiments, the spacer layer 120 may be a conductor, such as Cu or might have another structure, for example a granular layer including conductive channels in an insulating matrix. The nonmagnetic spacer layers 220 and 240 are generally desired to have different thicknesses. For example, the thicknesses of the spacer layers 220 and 240 may be ten percent different.

The magnetic junction 200 may have improved performance. The asymmetric free layer 230 may be switched using spin transfer torque. Thus, a more localized physical phenomenon may be used to write to the magnetic junction 200. The magnetic junction 200 may have stable magnetic states of the asymmetric free layer 230 oriented perpendicular-to-plane, which may improve spin transfer based switching. The magnetic junction 200 may have an enhanced magnetoresistance/tunneling magnetoresistance that may be due to the asymmetric free layer 230. Thus, performance of a device utilizing the magnetic junction 200 may be improved.

Figure 10:
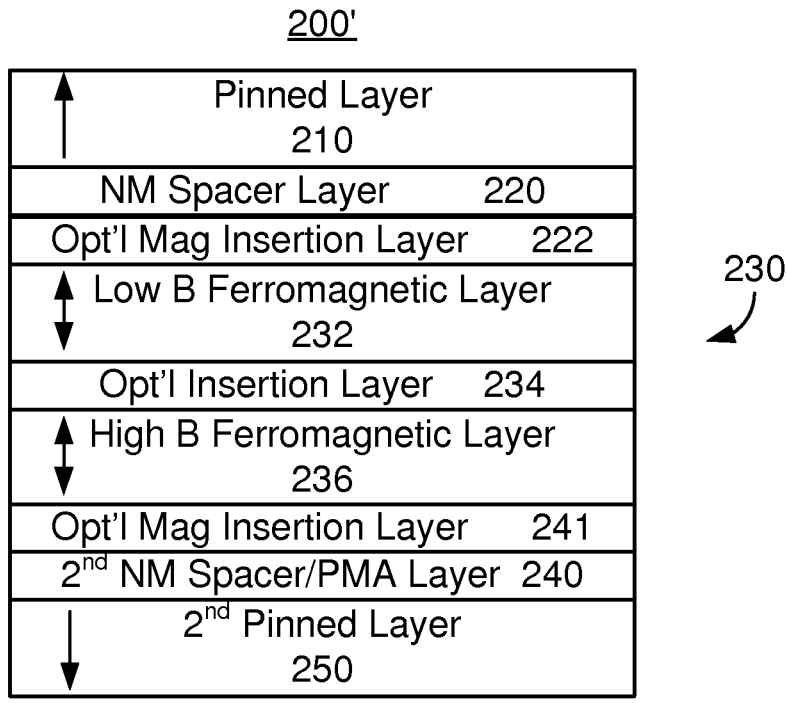
FIG. 10 depicts another exemplary embodiment of a dual magnetic junction usable in a magnetic memory programmable using spin transfer torque and which includes an asymmetric free layer.

FIG. 10 depicts another exemplary embodiment of a magnetic junction 200' usable in a magnetic device. The magnetic device in which the magnetic junction 200' is used may be used in a variety of applications. For example, the magnetic device, and thus the magnetic junction, may be used in a magnetic memory such as an STT-MRAM. For clarity, FIG. 10 is not to scale.

The dual magnetic junction 200' is analogous to the dual magnetic junction 200. Consequently, analogous components are labeled similarly. The magnetic junction 200' thus includes a pinned layer 210, a nonmagnetic spacer layer 220, an asymmetric free layer 230, a nonmagnetic spacer layer/PMA inducing layer 240 and pinned layer 250 analogous to those depicted in FIGS. 8-9. The free layer 20 is also shown as including the low boron content ferromagnetic layer 232, optional insertion layer 234 and high boron content ferromagnetic layer 236. The layers 232, 234 and 236 are shown with a particular orientation. In other embodiments, the orientation may vary. For example, the order of the layers 232, 234, and 236 may be reversed such that the layer 232 is closest to the nonmagnetic spacer layer/PMA inducing layer 240. The magnetic junction 200' is also configured to allow the free layer 230 to be switched between stable magnetic states when a write current is passed through the magnetic junction 200'. Thus, the free layer 230 is switchable utilizing spin transfer torque.

The structure and function of the layers 210, 220, 230, 232, 234, 236, 240 and 250 are analogous to those described above. For example, the free layer 230 may have its magnetic moments oriented perpendicular-to-plane when stable, as shown in FIG. 10, and has an asymmetric boron concentration. The gradient in the boron concentration for the free layer 230 and the layer(s) 232 and 236 is analogous to that discussed above. In some embodiments, the layer 234 may be omitted.

The magnetic junction 200' also includes magnetic insertion layer(s) 222 and 241. The magnetic insertion layers 222 and 241 are analogous to the layer 122 described in FIG. 4. Referring back to FIG. 10, one or both of the magnetic insertion layers 222 and 241 may be present. The magnetic insertion layers 222 and 241 may include at least one of Fe and CoFe. The magnetic insertion layers 222 and 241 may be desired to be Fe rich. For example an Fe layer or a $Co_1Fe_3$ layer might be used. In some embodiments, the magnetic insertion layer(s) 222 and/or 241 may be considered to be part of the free layer 230. The magnetic insertion layers 222 and 241 are generally desired to be thin. For example, the magnetic insertion layers 222 and 241 may each be at least two Angstroms and not more than six Angstroms thick. In some embodiments, the magnetic insertion layers 222 and 241 are nominally four Angstroms thick. Use of the magnetic insertion layer may improve the magnetoresistance of the magnetic junction 200'.

The magnetic junction 200' may have improved performance. The asymmetric free layer 230 may be switched using spin transfer torque. Thus, a more localized physical phenomenon may be used to write to the magnetic junction 200'. The magnetic junction 200' may have stable magnetic states of the asymmetric free layer 230 oriented perpendicular-to-plane, which may improve spin transfer based switching. The magnetic junction 200' may have an enhanced magnetoresistance/tunneling magnetoresistance that may be due to the asymmetric free layer 230. Thus, performance of a device utilizing the dual magnetic junction 200' may be improved.

Figure 11:
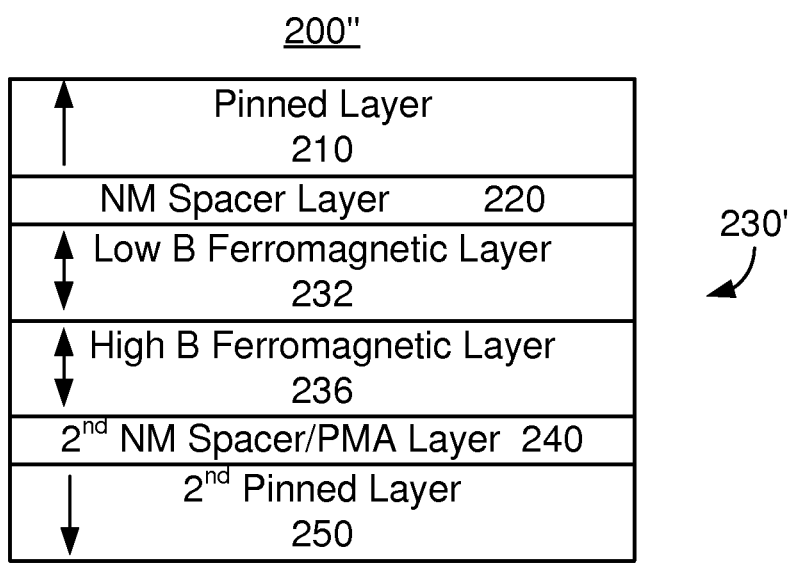
FIG. 11 depicts another exemplary embodiment of a dual magnetic junction usable in a magnetic memory programmable using spin transfer torque and which includes an asymmetric free layer.

FIG. 11 depicts another exemplary embodiment of a dual magnetic junction 200" usable in a magnetic device. The magnetic device in which the magnetic junction 200" is used may be used in a variety of applications. For example, the magnetic device, and thus the magnetic junction, may be used in a magnetic memory such as an STT-MRAM. For clarity, FIG. 11 is not to scale.

The magnetic junction 200" is analogous to the magnetic junction(s) 200 and/or 200'. Consequently, analogous components are labeled similarly. The magnetic junction 200" thus includes a pinned layer 210, a nonmagnetic spacer layer 220, an asymmetric free layer 230', a nonmagnetic spacer/PMA inducing layer 240 and a pinned layer 250 analogous to the layers 220, 230, 240 and 250 depicted in FIGS. 8-10. The free layer 230' is also shown as including the low boron content ferromagnetic layer 232 and high boron content ferromagnetic layer 236. The layers 232 and 236 are shown with a particular orientation. In other embodiments, the orientation may vary. For example, the order of the layers 232 and 236 may be reversed such that the layer 232 is closest to the nonmagnetic spacer/PMA inducing layer 240. The magnetic junction 200" is also configured to allow the free layer 230' to be switched between stable magnetic states when a write current is passed through the magnetic junction 200". Thus, the free layer 230' is switchable utilizing spin transfer torque.

The structure and function of the layers 210, 220, 230', 232, 236, 240 and 250 are analogous to those described above for the layers 210, 220, 230, 232, 236, 240 and 250, respectively. For example, the free layer 230' may have its magnetic moments oriented perpendicular-to-plane when stable, as shown in FIG. 11 and has an asymmetric boron concentration. The gradient in the boron concentration for the free layer 230' and the layer(s) 232 and 236 is analogous to that discussed above.

In the magnetic junction 200", the nonmagnetic insertion layer is omitted from the free layer 230'. Thus, the layers 232 and 236 share an interface. As a result, the free layer 230' may be thinner in order to ensure that the magnetic moment of the free layer 230' is perpendicular-to-plane. For example, the sum of the thicknesses of the layers 232 and 236 may be on the order of twelve Angstroms.

The magnetic junction 200" may have improved performance. The asymmetric free layer 230' may be switched using spin transfer torque. Thus, a more localized physical phenomenon may be used to write to the magnetic junction 200". The magnetic junction 200" may have stable magnetic states of the asymmetric free layer 230' oriented perpendicular-to-plane, which may improve spin transfer based switching. The magnetic junction 200" may have an enhanced magnetoresistance/tunneling magnetoresistance that may be due to the asymmetric free layer 230'. Thus, performance of a device utilizing the magnetic junction 200" may be improved.

Figure 12:
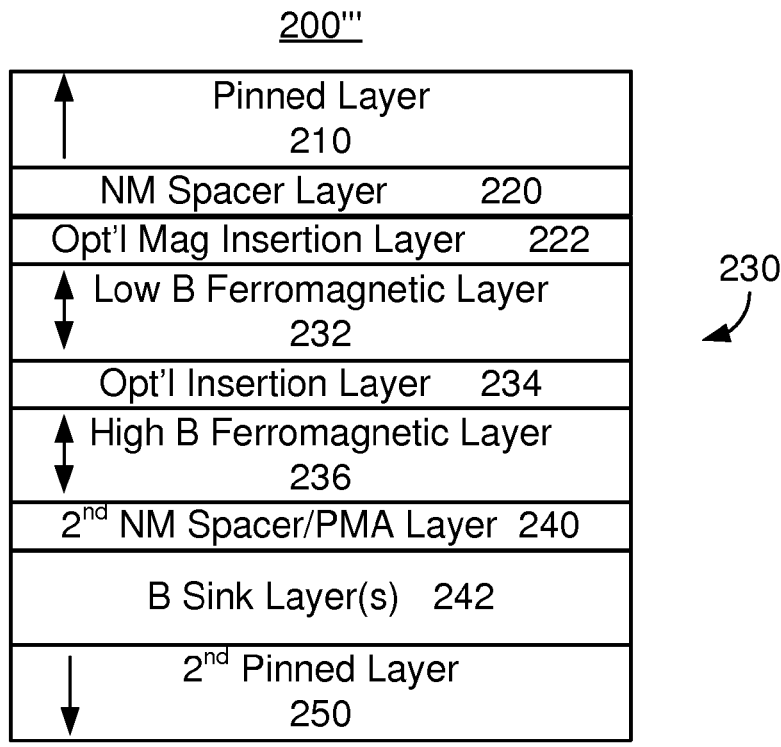
FIG. 12 depicts another exemplary embodiment of a dual magnetic junction usable in a magnetic memory programmable using spin transfer torque and which includes an asymmetric free layer.

FIG. 12 depicts another exemplary embodiment of a magnetic junction 200''' usable in a magnetic device. The magnetic device in which the magnetic junction 200''' is used may be used in a variety of applications. For example, the magnetic device, and thus the magnetic junction, may be used in a magnetic memory such as an STT-MRAM. For clarity, FIG. 12 is not to scale.

The magnetic junction 200''' is analogous to the magnetic junction(s) 200, 200' and/or 200". Consequently, analogous components are labeled similarly. The magnetic junction 200''' thus includes a pinned layer 210, a nonmagnetic spacer layer 220, an asymmetric free layer 230, a nonmagnetic spacer/PMA inducing layer 240 and an additional pinned layer 250 analogous to those depicted in FIGS. 8-11. The free layer 230 is also shown as including the low boron content ferromagnetic layer 232, optional insertion layer 234 and high boron content ferromagnetic layer 236. The layers 232, 234 and 236 are shown with a particular orientation. In other embodiments, the orientation may vary. For example, the order of the layers 232, 234, and 236 may be reversed such that the layer 232 is closest to the nonmagnetic spacer layer/PMA inducing layer 240. The magnetic junction 200''' is also configured to allow the free layer 230 to be switched between stable magnetic states when a write current is passed through the magnetic junction 200'''. Thus, the free layer 230 is switchable utilizing spin transfer torque.

The structure and function of the layers 210, 220, 230, 232, 234, 236, 240 and 250 are analogous to those described above. For example, the free layer 230 may have its magnetic moments oriented perpendicular-to-plane when stable, as shown in FIG. 12, and has an asymmetric boron concentration. The gradient in the boron concentration for the free layer 230 and the layer(s) 232 and 236 is analogous to that discussed above. In some embodiments, the layer 234 may be omitted.

The magnetic junction 200''' also includes a boron sink layer 242 such that the nonmagnetic spacer layer/PMA induction layer 240 is between the boron sink layer 242 and the free layer 230. The boron sink layer 242 is analogous to the boron sink layer 142 depicted in FIG. 6. In the embodiment shown in FIG. 12, the boron sink layer 242 also functions as a seed layer. However, in other embodiments, the boron sink layer 242 may be a capping layer, for example if the nonmagnetic spacer layer/PMA layer 240 is furthest from the bottom of the magnetic junction 200'''. The boron sink layer 242 may include material(s) that have an affinity for boron. For example, materials such as Ta, Fe, and/or CoFe may be used. The boron sink layer 242 may provide a location to which boron may diffuse during annealing or other processing of the magnetic junction 2200'''. Thus, stoichiometry of the remaining layers 210, 220, 230, 240 and 250 may be closer to that which is desired.

The magnetic junction 200''' may have improved performance. The asymmetric free layer 230 may be switched using spin transfer torque. Thus, a more localized physical phenomenon may be used to write to the magnetic junction 200'''. The magnetic junction 200''' may have stable magnetic states of the asymmetric free layer 230 oriented perpendicular-to-plane, which may improve spin transfer based switching. The magnetic junction 200''' may have an enhanced magnetoresistance/tunneling magnetoresistance that may be due to the asymmetric free layer 230. Thus, performance of a device utilizing the magnetic junction 200''' may be improved.

Figure 13:
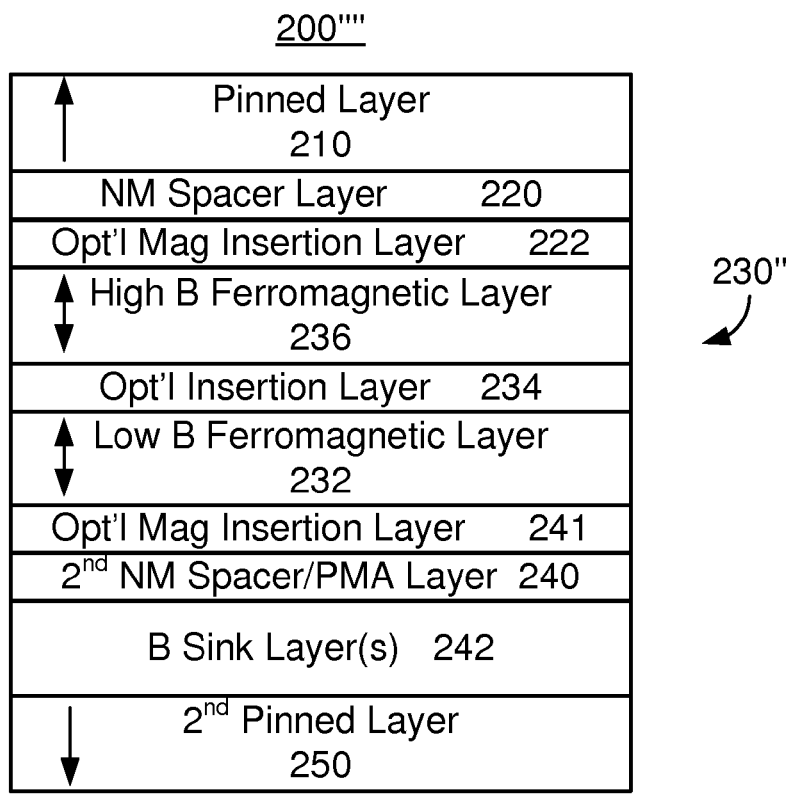
FIG. 13 depicts another exemplary embodiment of a dual magnetic junction usable in a magnetic memory programmable using spin transfer torque and which includes an asymmetric free layer.

FIG. 13 depicts another exemplary embodiment of a dual magnetic junction 200'''' usable in a magnetic device. The magnetic device in which the magnetic junction 200'''' is used may be used in a variety of applications. For example, the magnetic device, and thus the magnetic junction, may be used in a magnetic memory such as an STT-MRAM. For clarity, FIG. 13 is not to scale.

The magnetic junction 200'''' is analogous to the magnetic junction(s) 200, 200', 200'' and/or 200'''. Consequently, analogous components are labeled similarly. The magnetic junction 200'''' thus includes a pinned layer 210, a nonmagnetic spacer layer 220, an asymmetric free layer 230'', a nonmagnetic spacer layer/PMA inducing layer 240 and an additional pinned layer 250 analogous to those depicted in FIGS. 8-12. The free layer 230'' is also shown as including the low boron content ferromagnetic layer 232, optional insertion layer 234 and high boron content ferromagnetic layer 236. The magnetic junction 2100'''' is also configured to allow the free layer 230'' to be switched between stable magnetic states when a write current is passed through the magnetic junction 200''''. Thus, the free layer 230'' is switchable utilizing spin transfer torque.

The structure and function of the layers 210, 220, 230'', 232, 234, 236, 240 and 250 are analogous to those described above. For example, the free layer 230'' may have its magnetic moments oriented perpendicular-to-plane when stable, as shown in FIG. 13, and has an asymmetric boron concentration. The gradient in the boron concentration for the free layer 230 and the layer(s) 232 and 236 is analogous to that discussed above. However, in the embodiment shown, the order of the layers 232, 234, and 236 has been reversed such that the layer 232 is closest to the PMA inducing layer 240. In some embodiments, the layer 234 may be omitted.

The magnetic junction 200'''' is also shown as including an optional boron sink layer 242 and an optional magnetic insertion layers 222 and 241. The layers 222, 241 and 242 are analogous to those discussed above. Some combination of one or more of the layers 222, 241 and 242 may be included in the magnetic junction 200''''. Alternatively, one or more of the layers 222, 241 and 242 may be omitted.

The magnetic junction 200'''' may have improved performance. The asymmetric free layer 230'' may be switched using spin transfer torque. Thus, a more localized physical phenomenon may be used to write to the magnetic junction 200''''. The magnetic junction 200'''' may have stable magnetic states of the asymmetric free layer 230'' oriented perpendicular-to-plane, which may improve spin transfer based switching. The magnetic junction 200'''' may have an enhanced magnetoresistance/tunneling magnetoresistance that may be due to the asymmetric free layer 230''. Thus, performance of a device utilizing the magnetic junction 200'''' may be improved.

Note that FIGS. 8-13 have been described in the context of particular features. For example, certain layers have been included or omitted in various embodiments. However, one of ordinary skill in the art will recognize that the one or more of the features in the embodiments 200, 200', 200'', 200''' and/or 200'''' depicted in FIGS. 8-13 may be combined.

Figure 14:
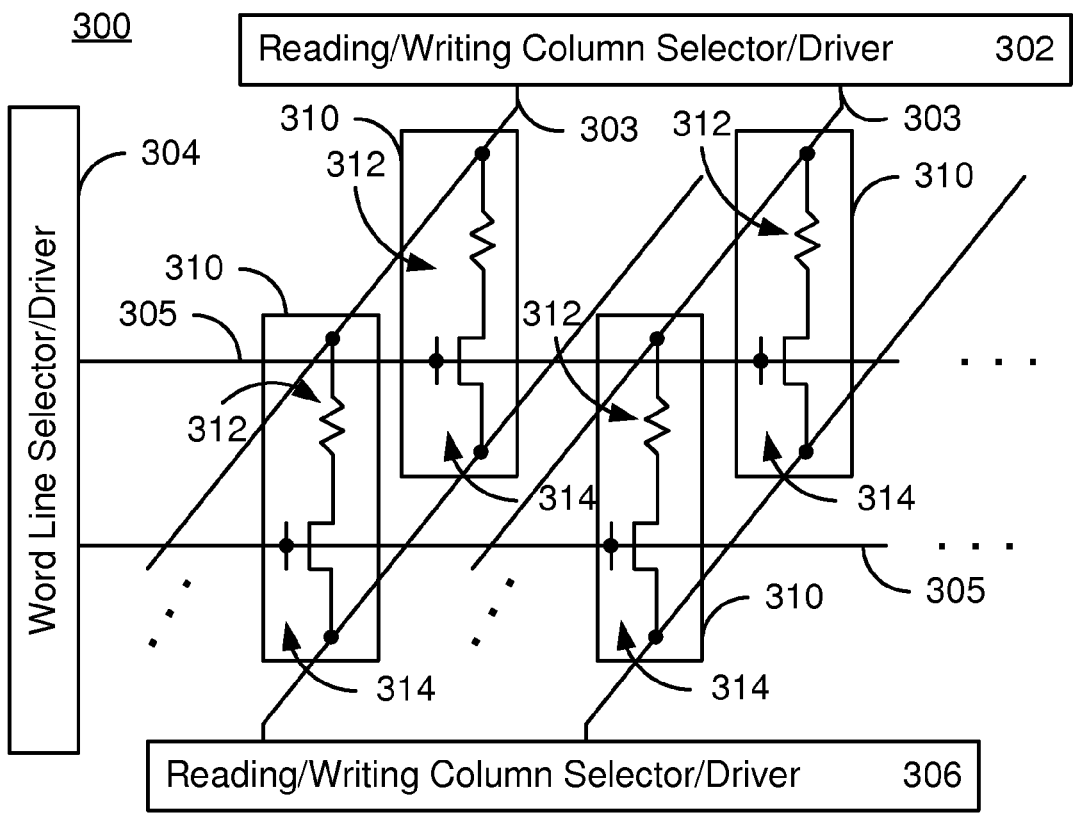
FIG. 14 depicts an exemplary embodiment of a memory utilizing magnetic junctions in the memory element(s) of the storage cell(s)

FIG. 14 depicts an exemplary embodiment of a memory 300 that may use one or more of the magnetic junctions 100, 100', 100'', 100''', 100'''', 200, 200', 200'', 200''' and/or 200''''. Note, however, that one or more of the magnetic junctions 100, 100', 100'', 100''', 100'''', 200, 200', 200'', 200''' and/or 200'''' might be used in a different device and/or a memory having a different configuration. The magnetic memory 300 includes reading/writing column select drivers 302 and 306 as well as word line select driver 304. Other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junction(s) 312 may be one of the magnetic junctions 100, 100', 100'', 100''', 100'''', 200, 200', 200'', 200''' and/or 200'''' disclosed herein. Thus, the free layers of the magnetic junctions 312 is asymmetric. Although one magnetic junction 312 is shown per cell 310, in other embodiments, another number of magnetic junctions 312 may be provided per cell. As such, the magnetic memory 300 may enjoy the benefits described above.

Figure 15:
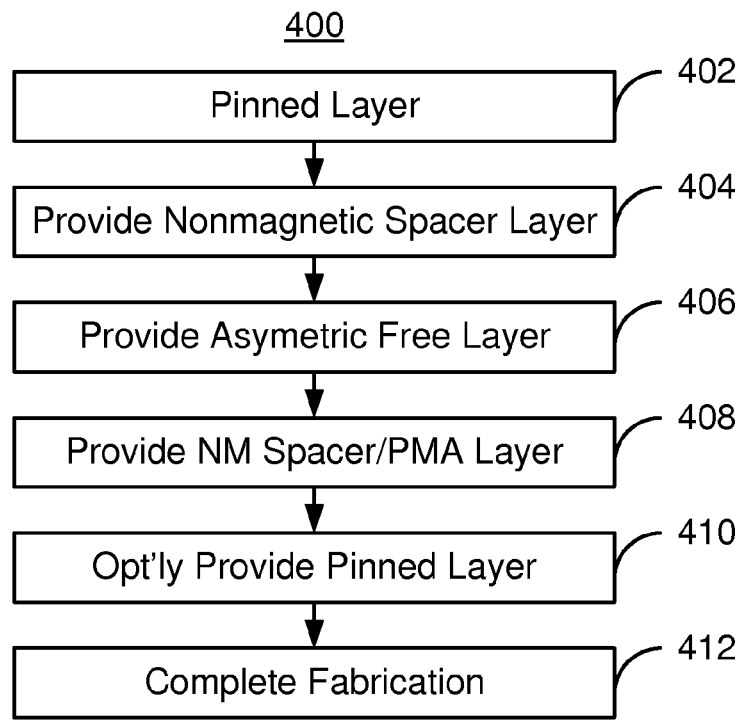
FIG. 15 depicts an exemplary embodiment of a method for providing a magnetic junction usable in a magnetic memory programmable using spin transfer torque and which includes an asymmetric free layer.

FIG. 15 depicts an exemplary embodiment of a method 400 for fabricating magnetic junction. For simplicity, some steps may be omitted or combined. The method 400 is described in the context of the magnetic junction 100. The method 400 may also be used in fabricating one or more of the magnetic junctions 100', 100'', 100''', 100'''', 200, 200', 200'', 200''' and/or 200''''. The method 400 may be used on other magnetic junctions. Further, the method 400 may be incorporated into fabrication of magnetic memories. Thus the method 400 may be used in manufacturing a STT-MRAM or other magnetic memory.

The pinned layer 110 is provided, via step 402. Step 402 may include depositing the desired materials at the desired thickness of the pinned layer 110. The nonmagnetic layer 120 is provided, via step 404. Step 404 may include depositing the desired nonmagnetic materials. For example, MgO may be deposited. In addition, the desired thickness of material may be deposited in step 404. The asymmetric free layer 130 is provided, via step 406. Step 406 may include providing layers 132, 134 and 136. In other embodiments, a single layer having a substantially continuous variation in the boron concentration may be provided. The PMA inducing layer 140 is provided, via step 408. If a dual magnetic junction such as the junction 200, 200', 200'', 200''' and/or 200'''' is provided, then the layer provided in step 308 is also a nonmagnetic spacer layer for the dual junction. The pinning layer 250 may optionally be provided, via step 410. Fabricating of the magnetic junction 100 may then be completed, via step 412. Consequently, the benefits of the magnetic junction(s) 100, 100', 100'', 100''', 100'''', 200, 200', 200'', 200''' and/or 200'''' may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:
1. A magnetic junction for use in a magnetic device comprising:
a pinned layer;
a nonmagnetic spacer layer;
an asymmetric free layer, the nonmagnetic spacer layer residing between the pinned layer and the asymmetric free layer, the asymmetric free layer including a first ferromagnetic layer having a first boron content and a second ferromagnetic layer having a second boron content, the second boron content being less than the first boron content, the first boron content and the second boron content being greater than zero atomic percent, the first ferromagnetic layer and the second ferromagnetic layer each containing at least one of Co and CoFe; and a perpendicular magnetic anisotropy (PMA) inducing layer;

wherein the magnetic junction is configured such that the asymmetric free layer is switchable between a plurality of stable magnetic states when a write current is passed through the magnetic junction.

2. The magnetic junction of claim 1 wherein the free layer further includes a nonmagnetic insertion layer between the first ferromagnetic layer and the second ferromagnetic layer.

3. The magnetic junction of claim 2 wherein the nonmagnetic insertion layer includes at least one of Bi, Ta, W, V, I, Zn, Nb, Ag, Cd, Hf, Os, Mo, Ca, Hg, Sc, Y, Sr, Mg, Ti, Ba, K, Na, Rb, Pb, and Zr.

4. A magnetic device including a magnetic memory and comprising:

a plurality of magnetic storage cells for the magnetic memory, each of the plurality of magnetic storage cells including at least one magnetic junction, each of the at least one magnetic junction including a pinned layer, a nonmagnetic spacer layer, an asymmetric free layer, and a perpendicular magnetic anisotropy (PMA) inducing layer, the nonmagnetic spacer layer being between the free layer and the pinned layer, the asymmetric free layer including a first ferromagnetic layer having a first boron content and a second ferromagnetic layer having a second boron content, the second boron content being less than the first boron content, the first boron content and the second boron content being greater than zero atomic percent, the first ferromagnetic layer and the second ferromagnetic layer each containing at least one of Co and CoFe, the magnetic junction being configured such that the asymmetric free layer is switchable between a plurality of stable magnetic states when a write current is passed through the magnetic junction; and a plurality of bit lines coupled with the plurality of magnetic storage cells.

5. The magnetic memory of claim 4 wherein the free layer further includes a nonmagnetic insertion layer between the first ferromagnetic layer and the second ferromagnetic layer.

6. The magnetic memory of claim 5 wherein the nonmagnetic insertion layer includes at least one of Bi, Ta, W, V, I, Zn, Nb, Ag, Cd, Hf, Os, Mo, Ca, Hg, Sc, Y, Sr, Mg, Ti, Ba, K, Na, Rb, Pb, and Zr.

7. A method for providing a magnetic junction for use in a magnetic device comprising:

providing a pinned layer;

providing a nonmagnetic spacer layer;

providing an asymmetric free layer, the nonmagnetic spacer layer residing between the pinned layer and the asymmetric free layer, the asymmetric free layer including a first ferromagnetic layer having a first boron content and a second ferromagnetic layer having a second boron content, the second boron content being less than the first boron content, the first boron content and the second boron content being greater than zero atomic percent, the first ferromagnetic layer and the second ferromagnetic layer each containing at least one of Co and CoFe; and providing a perpendicular magnetic anisotropy (PMA) inducing layer;

wherein the magnetic junction is configured such that the asymmetric free layer is switchable between a plurality of stable magnetic states when a write current is passed through the magnetic junction.

* * * * *